(12) United States Patent
Ishibashi et al.

(10) Patent No.: US 10,836,276 B2
(45) Date of Patent: Nov. 17, 2020

(54) DISPLAY DEVICE

(71) Applicant: TOYOTA JIDOSHA KABUSHIKI KAISHA, Toyota (JP)

(72) Inventors: Masahisa Ishibashi, Nisshin (JP); Yasutaka Yoshimura, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/425,240

(22) Filed: Feb. 6, 2017

(65) Prior Publication Data

US 2017/0274793 A1 Sep. 28, 2017

(30) Foreign Application Priority Data

Mar. 22, 2016 (JP) .................................. 2016-057321

(51) Int. Cl.
*B60L 58/10* (2019.01)
*B60L 58/13* (2019.01)
*G01R 31/36* (2020.01)
*G01R 31/382* (2019.01)

(52) U.S. Cl.
CPC ............... *B60L 58/13* (2019.02); *B60L 58/10* (2019.02); *B60L 2250/16* (2013.01); *B60L 2260/26* (2013.01); *G01R 31/3646* (2019.01); *G01R 31/382* (2019.01); *Y02T 10/7005* (2013.01); *Y02T 10/705* (2013.01); *Y02T 10/7044* (2013.01)

(58) Field of Classification Search
None
See application file for complete search history.

(56) References Cited

U.S. PATENT DOCUMENTS

| 8,289,143 | B2 * | 10/2012 | Mizutani | B60L 53/305 340/438 |
| 8,670,885 | B2 * | 3/2014 | Gilman | B60W 50/0097 340/425.5 |
| 8,849,491 | B2 * | 9/2014 | Higashitani | B60W 10/08 701/22 |
| 2016/0243941 | A1 * | 8/2016 | Kishida | B60K 35/00 |
| 2018/0321323 | A1 * | 11/2018 | Dubarry | G01R 31/3835 |

FOREIGN PATENT DOCUMENTS

| CN | 105904980 A | 8/2016 |
| JP | 2011-057116 A | 3/2011 |
| JP | 2016-155398 A | 9/2016 |

* cited by examiner

*Primary Examiner* — James M McPherson
(74) *Attorney, Agent, or Firm* — Oliff PLC

(57) ABSTRACT

A display device is mounted on a hybrid vehicle provided with an internal-combustion engine, an electric motor, an electricity storage device configured to store electricity used to drive the electric motor, and a charger configured to externally charge the electricity storage device using electricity from an external power supply. The display device includes a display and a display controller. The display displays a residual capacity of the electricity storage device. When the residual capacity of the electricity storage device is substantially zero, the display controller displays the residual capacity greater than zero on the display.

3 Claims, 4 Drawing Sheets

DISPLAY DEVICE

BACKGROUND

1. Technical Field

The present disclosure relates to a technique for displaying a residual capacity of an electricity storage device.

2. Description of Related Art

Patent Document 1 discloses a display device used in a hybrid vehicle provided with an engine and an electric motor as power sources for generating vehicle drive power, and the display device displays a residual capacity of an electricity storage device that supplies electricity to the electric motor.

[Patent Document 1] Japanese Unexamined Patent Application Publication No. 2011-57116

In the abovementioned technique, however, when the residual capacity of the electricity storage device becomes zero and when the residual capacity displayed on the display device also becomes zero, the user may feel anxiety about whether the vehicle will be unable to run, even though the vehicle can still run with the engine.

SUMMARY

The embodiments have been made in view of such a situation, and a purpose thereof is to provide a technique for preventing a user feeling anxious even when the residual capacity of an electricity storage device becomes substantially zero.

To solve the problem above, a display device of one embodiment is mounted on a hybrid vehicle comprising an internal-combustion engine configured to generate vehicle drive power, an electric motor configured to generate the vehicle drive power, an electricity storage device configured to store electricity used to drive the electric motor, and a charger configured to externally charge the electricity storage device using electricity from an external power supply, and the display device comprises: a display configured to display a residual capacity of the electricity storage device; and a display controller configured to display, when the residual capacity of the electricity storage device is substantially zero, the residual capacity greater than zero on the display.

According to the embodiment, even when the residual capacity of the electricity storage device is substantially zero, the display displays the residual capacity greater than zero, making a user unaware that the residual capacity of the electricity storage device is substantially zero. This prevents the user feeling anxious.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Various embodiments will now be described by reference to the drawings. The embodiments are illustrative and are not intended to be limiting.

Figure 1:
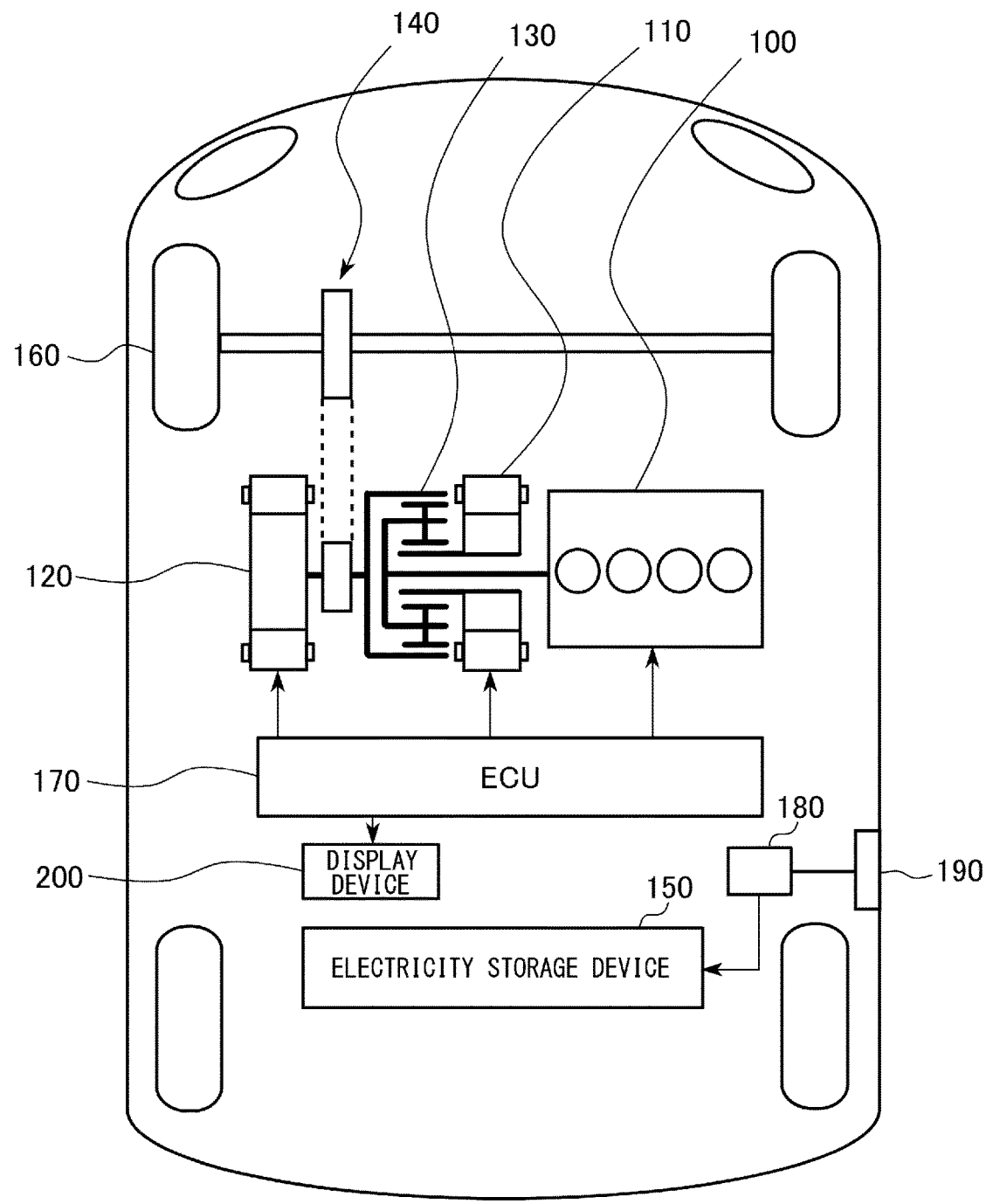
FIG. 1 is a block diagram that shows a schematic configuration of a hybrid vehicle 1 according to an embodiment.

FIG. 1 is a block diagram that shows a schematic configuration of a hybrid vehicle 1 according to an embodiment. The hybrid vehicle 1 comprises an engine (internal-combustion engine) 100, a first electric motor (power generator, MG: Motor-Generator) 110, a second electric motor 120, a power split device 130, a reducer 140, an electricity storage device 150, drive wheels 160, an electronic control unit (ECU) 170, a charger 180, a charge inlet 190, and a display device 200.

The engine 100, first electric motor 110, and second electric motor 120 are connected to the power split device 130. The hybrid vehicle 1 is driven by drive power provided from at least one of the engine 100 and the second electric motor 120. The drive power generated by the engine 100 is divided between two systems by the power split device 130: one is a system by which the drive power is transmitted to the drive wheels 160 via the reducer 140; and the other is a system by which the drive power is transmitted to the first electric motor 110.

The first electric motor 110 can generate electricity using the drive power provided from the engine 100 and divided by the power split device 130. More specifically, when the residual capacity {hereinafter, referred to as "state of charge (SOC)"} of the electricity storage device 150 is low, the engine 100 is started and the first electric motor 110 generates electricity. With the electricity generated by the first electric motor 110, the electricity storage device 150 is charged.

The second electric motor 120 generates drive power using at least one of the electricity stored in the electricity storage device 150 and the electricity generated by the first electric motor 110. The drive power generated by the second electric motor 120 is then transmitted to the drive wheels 160 via the reducer 140.

During braking of the vehicle, for example, the drive wheels 160 drive the second electric motor 120 via the reducer 140, so that the second electric motor 120 operates as a power generator. Namely, the second electric motor 120 operates as a regenerative braking system for converting braking energy into electricity. Accordingly, with the electricity generated by the second electric motor 120, the electricity storage device 150 is charged.

The electricity storage device 150 is a rechargeable DC power supply, including a nickel-metal hydride battery, a lithium-ion battery, and other secondary batteries. The electricity storage device 150 stores electricity used to drive the second electric motor 120. Besides the electricity generated by the first electric motor 110 and the second electric motor 120, electricity supplied from a power supply outside the vehicle (hereafter, referred to as an external power supply) is also stored in the electricity storage device 150, as will be described later. Charging an electricity storage device with an external power supply will be referred to as external charging. As the electricity storage device 150, a high-capacity capacitor may also be used.

The ECU 170 switches the driving mode between an EV mode (a first driving mode) and an HV mode (a second driving mode), based on the SOC of the electricity storage device 150. In the EV mode, the hybrid vehicle 1 is driven mainly by drive power from the second electric motor 120 when the SOC of the electricity storage device 150 is greater than a predetermined value. In the EV mode, the first electric motor 110 does not generate electricity using drive power from the engine 100, so that internal charging of the electricity storage device 150 is limited. Although the EV mode aims to improve the fuel consumption rate by maintaining the engine 100 in the stop state, the engine 100 may be started when a drive power request is given from the driver for rapid acceleration or the like, when a request other than a drive power request, such as a request for air conditioning, is given or during a catalyst warming-up time, or when other conditions are met.

In the HV mode, power generation performed by the first electric motor 110 is controlled so that the SOC of the electricity storage device 150 is maintained within a predetermined control range after the SOC is reduced to the predetermined value or less. For the power generation performed by the first electric motor 110, the engine 100 is started. As described previously, drive power generated by the engine 100 is also partly used for the traveling of the hybrid vehicle 1.

In the HV driving mode, a control device 2 determines target values of the rotational speed of the engine 100, the amount of electricity generated by the first electric motor 110, and the torque of the second electric motor 120 so as to optimize the overall fuel economy, based on a signal from each sensor, the traveling state, and the accelerator position, for example.

The target values are determined also in consideration of the SOC of the electricity storage device 150, and electricity stored in or discharged from the electricity storage device 150 is managed so that the SOC of the electricity storage device 150 is maintained within a predetermined control range with a predetermined control center value as the center. More specifically, since the difference between the electricity generated by the first electric motor 110 using part of drive power from the engine 100 and the electricity consumed by the second electric motor 120 to generate drive power corresponds to the electricity stored in or discharged from the electricity storage device 150, the amount of electricity generated by the first electric motor 110 and the amount of electricity consumed by the second electric motor 120 are determined according to the SOC of the electricity storage device 150. Further, since the electricity stored in or discharged from the electricity storage device 150 is also affected by the traveling state of the hybrid vehicle 1, the "predetermined control range" within which the SOC of the electricity storage device 150 is maintained is not necessarily clearly defined.

Also in the HV mode, the driving mode can be temporarily switched to the EV mode only while a predetermined amount of electricity is consumed, according to a switch operation by a user.

The ECU 170 controls operations of the engine 100, first electric motor 110, and second electric motor 120, according to the driving mode. The ECU 170 also performs display control of the display device 200, which will be described later. The ECU 170 may be divided into multiple ECUs for the respective functions. The configuration of the ECU 170 will be described later.

Electricity supplied from an external power supply (not illustrated) is input to the charge inlet 190, and the charger 180 converts the voltage of the electricity into a predetermined charge voltage. The electricity of which the voltage is thus converted by the charger 180 is then supplied to the electricity storage device 150, which is charged accordingly. The charge inlet 190 is configured to be connectable with a charging cable connected to the external power supply and is a power interface for receiving electricity supplied from the external power supply.

The display device 200 is mounted within the vehicle cabin of the hybrid vehicle 1 and displays the SOC of the electricity storage device 150. More specifically, the display device 200 changes the display regions according to the SOC. The display device 200 separately displays a portion of SOC consumed in the EV mode and a portion of SOC maintained in the HV mode. The display device 200 may also have a car navigation function.

Figure 2:
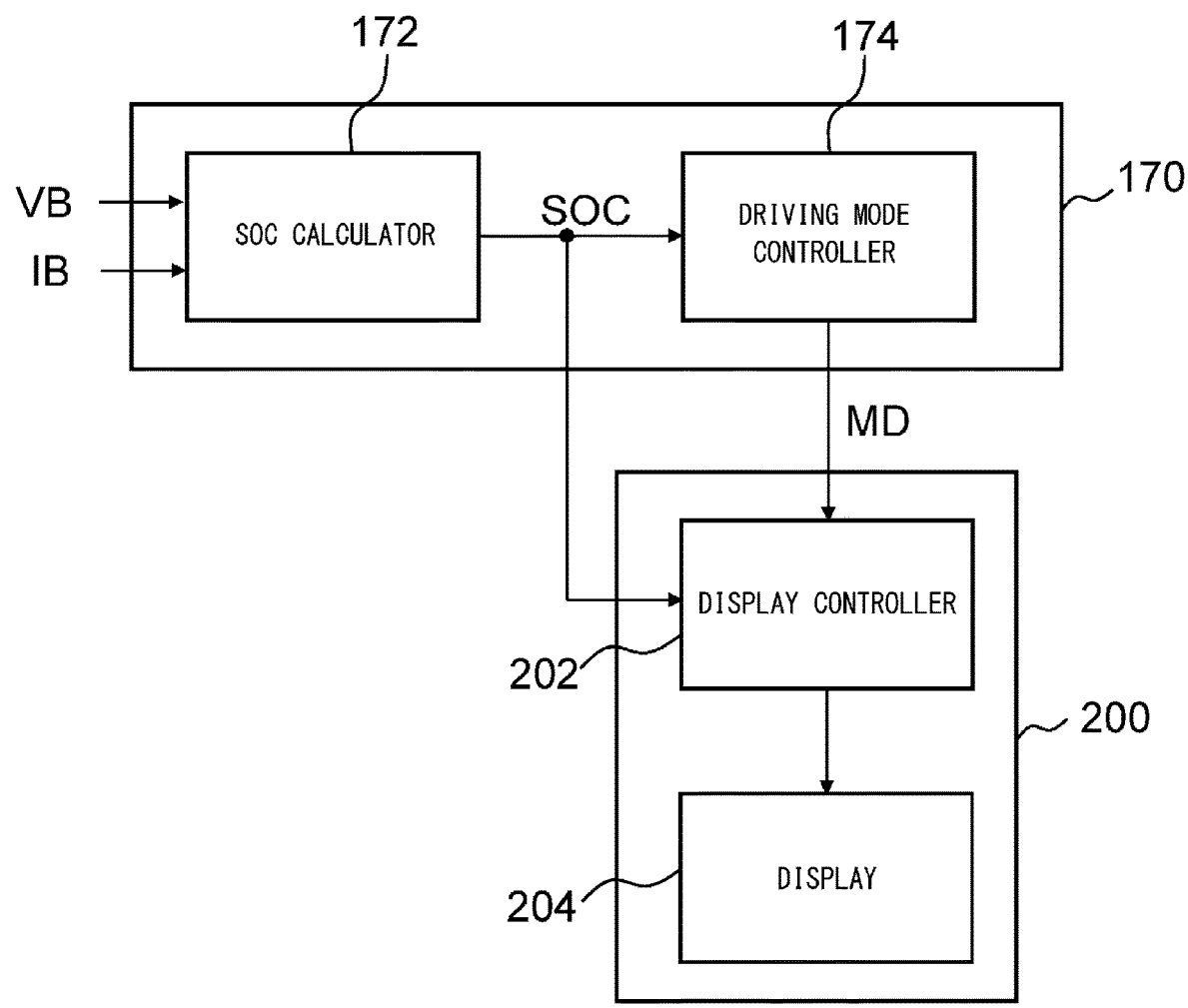
FIG. 2 is a block diagram that shows a part of an ECU relevant to SOC display control and a display device shown in FIG. 1.

FIG. 2 is a block diagram that shows a part of the ECU 170 relevant to SOC display control and the display device 200 shown in FIG. 1. The ECU 170 comprises an SOC calculator 172 and a driving mode controller 174. The display device 200 comprises a display controller 202 and a display 204.

The SOC calculator 172 calculates the SOC of the electricity storage device 150 based on a voltage VB and a current IB output from the electricity storage device 150. For the method for calculating the SOC, various publicly-known methods can be employed. The voltage VB and current IB are detected by a voltage sensor and a current sensor, which are not illustrated.

The driving mode controller 174 switches the driving mode between the EV mode and the HV mode, based on the SOC calculated by the SOC calculator 172. More specifically, the driving mode controller 174 sets the driving mode to the EV mode when external charging is performed and the SOC exceeds a predetermined value, and the driving mode controller 174 maintains the EV mode until the SOC becomes the predetermined value or less. Once the SOC decreases to the predetermined value, the driving mode controller 174 switches the driving mode from the EV mode to the HV mode and maintains the HV mode until external charging is performed again. The driving mode controller 174 outputs a mode signal MD indicating a driving mode.

Based on the SOC calculated by the SOC calculator 172 and the mode signal MD output from the driving mode controller 174, the display controller 202 controls display of the SOC on the display 204. When the SOC of the electricity storage device 150 is substantially zero, the display controller 202 displays the SOC greater than zero on the display 204.

The display controller 202 includes a computer, and each of various functions of the display controller 202 can be implemented by a circuit block, a memory, an LSI or the like in terms of hardware, and by a memory-loaded program or the like in terms of software. Accordingly, it will be obvious to those skilled in the art that the various functions of the display controller 202 may be implemented in a variety of forms by hardware only, software only, or a combination thereof, and the form is not limited to any of them.

The display 204 may include a liquid crystal panel, for example, and displays the SOC of the electricity storage device 150.

There will now be described the operations of the hybrid vehicle 1 and the SOC displayed on the display 204.

After external charging is performed, the hybrid vehicle 1 is operated to start traveling. Thereafter, until the SOC of the electricity storage device 150 becomes a predetermined value or less, the hybrid vehicle 1 travels in the EV mode.

In the EV mode, electricity supplied from an external power supply and stored in the electricity storage device 150 is actively used for the traveling, and the hybrid vehicle 1 travels with the engine 100 stopped unless greater drive power for traveling is required for rapid acceleration, hill-climbing, or the like. Even in the EV mode, the engine 100 could be operated when such greater drive power for traveling is required.

Figure 3:
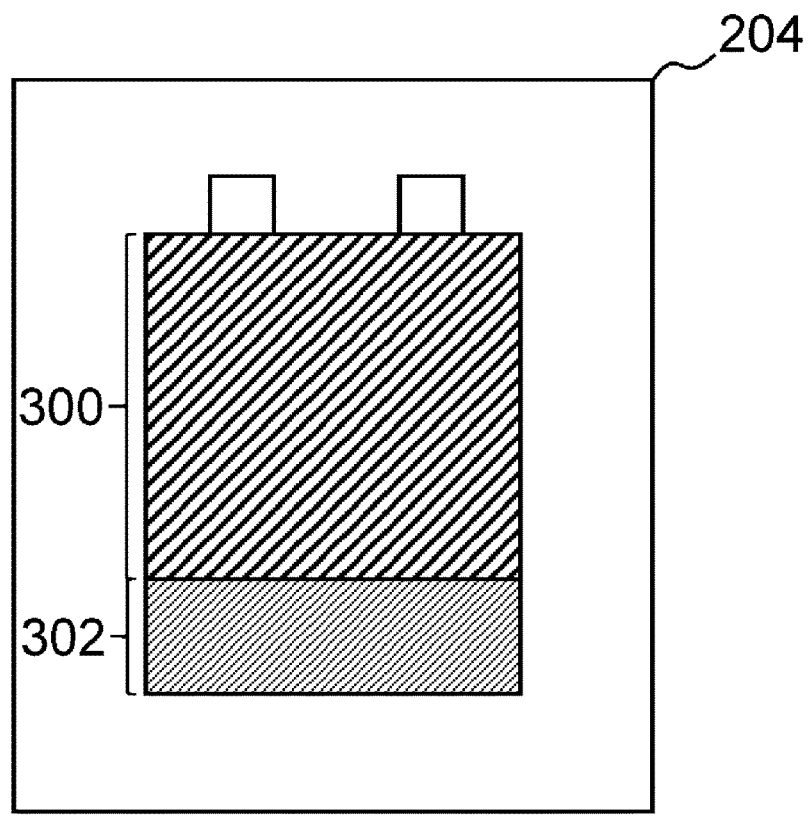
FIG. 3 is a diagram that shows a display state of a display shown in FIG. 2 in an EV mode.

FIG. 3 is a diagram that shows a display state of the display 204 shown in FIG. 2 in the EV mode. In FIG. 3, the SOC is 100%, so that the maximum areas of a first display region 300 and a second display region 302 are displayed. In the EV mode, the display 204 displays the SOC of the electricity storage device 150 so that the displayed color of the first display region 300, which indicates an SOC greater than a predetermined value, is different from the displayed color of the second display region 302, which indicates an SOC less than or equal to the predetermined value. For example, the first display region 300 may be displayed in green, and the second display region 302 may be displayed in white. With a decrease of the SOC, the displayed area of the first display region 300 also decreases. The displayed area of the first display region 300 gives an indication of a travelable distance in the EV mode.

Once the SOC of the electricity storage device 150 decreases to the predetermined value, the hybrid vehicle 1 starts to travel in the HV mode. Even in the HV mode, the second electric motor 120 could be operated, and the engine 100 could be stopped.

Figure 4:
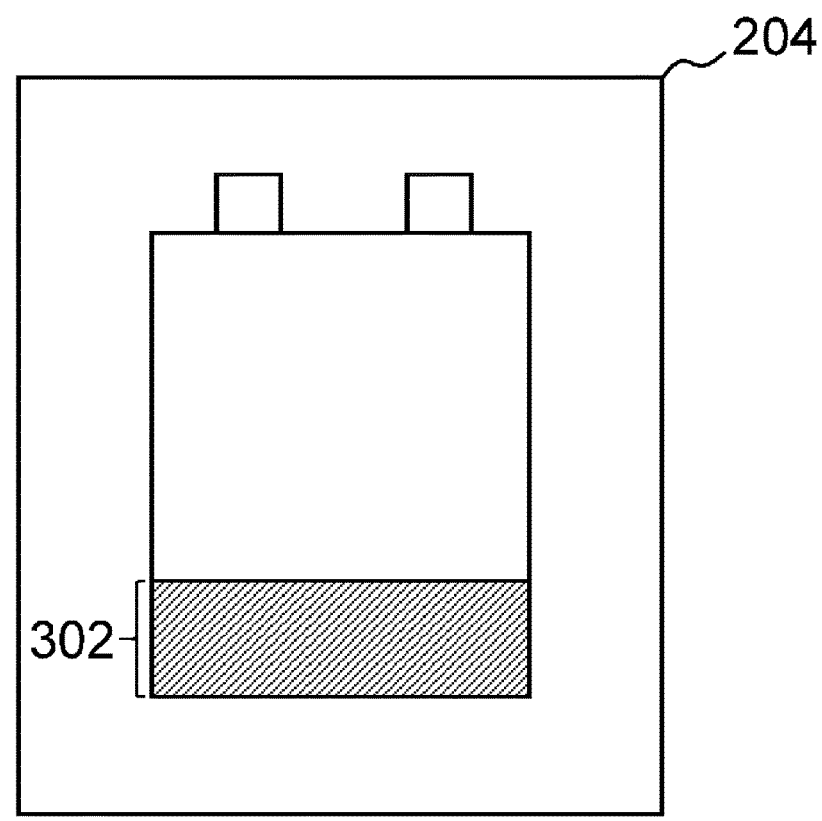
FIG. 4 is a diagram that shows a display state of the display shown in FIG. 2 in an HV mode.

FIG. 4 is a diagram that shows a display state of the display 204 shown in FIG. 2 in the HV mode. In the HV mode, the display 204 displays the SOC of the electricity storage device 150 in a color same as that of the second display region 302 displayed in the EV mode. In FIG. 4, the SOC is 20%, so that the first display region 300 is not displayed, and the maximum area of the second display region 302 is displayed. With a decrease of the SOC, the displayed area of the second display region 302 also decreases but does not become zero.

During the HV mode, if electricity is continuously consumed greatly but the electricity storage device 150 remains uncharged, such as when a user provides switch operations to use the EV mode multiple times for a short period of time, the SOC of the electricity storage device 150 will decrease and may become substantially zero. Even though the SOC is substantially zero, since the engine 100 can generate vehicle drive power, the hybrid vehicle 1 can still run. More specifically, an auxiliary battery, not illustrated, supplies electricity necessary for the operation of the engine 100, so that the engine 100 can generate vehicle drive power.

Figure 5:
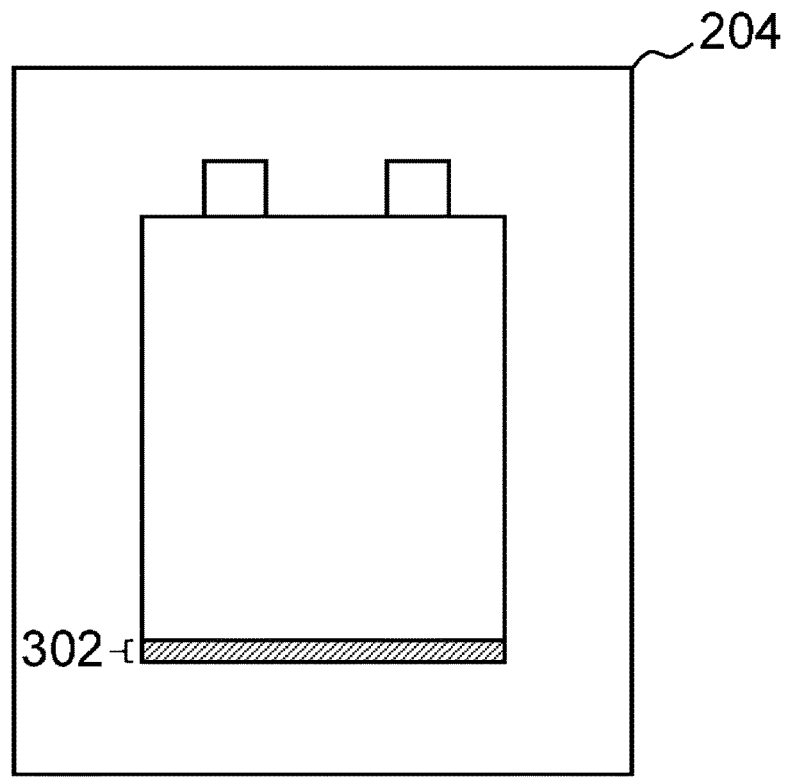
FIG. 5 is a diagram that shows a display state of the display shown in FIG. 2 when the SOC becomes substantially zero in the HV mode.

FIG. 5 is a diagram that shows a display state of the display 204 shown in FIG. 2 when the SOC becomes substantially zero in the HV mode. Even when the SOC is substantially zero, the display 204 displays the minimum area of the second display region 302. This makes a user unaware that the SOC of the electricity storage device 150 is substantially zero, thereby preventing the user feeling unnecessary anxiety about whether the vehicle will be unable to run.

Figure 6:
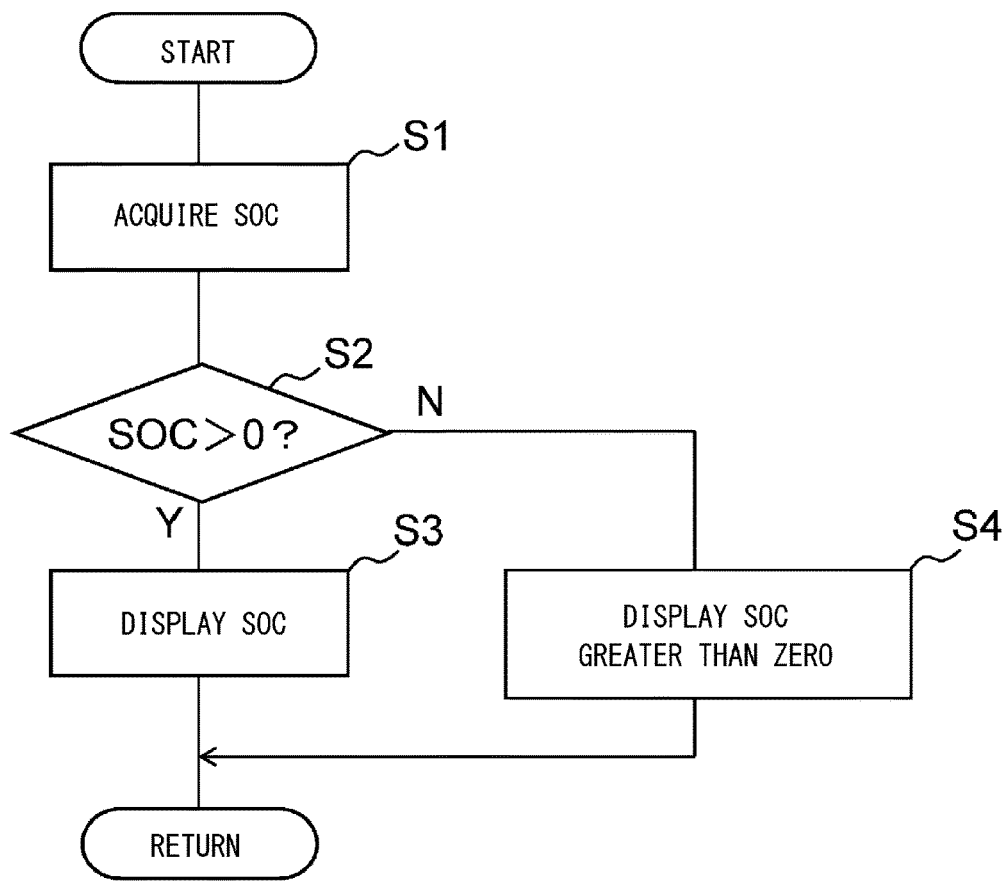
FIG. 6 is a flowchart that shows processing for controlling SOC display according to an embodiment.

FIG. 6 is a flowchart that shows processing for controlling SOC display according to an embodiment. The processing shown in FIG. 6 is performed regularly with a predetermined period. The display controller 202 acquires the SOC from the SOC calculator 172 (S1). When the acquired SOC is greater than zero (Y at S2), the display controller 202 displays the SOC on the display 204 (S3). When the acquired SOC is substantially zero (N at S2), the display controller 202 displays the SOC greater than zero on the display 204 (S4).

According to the present embodiment, even when the residual capacity of the electricity storage device 150 is substantially zero, the display 204 displays the residual capacity greater than zero, making a user unaware that the SOC of the electricity storage device 150 is substantially zero. This prevents the user feeling anxious.

The hybrid vehicle 1 is particularly a plug-in hybrid vehicle of which the electricity storage device 150 can be charged using an external power supply, so that the hybrid vehicle 1 can travel in the EV mode most of the time in normal use. Since the engine 100 is started less frequently in the EV mode than in the HV mode, a user may become familiar with the driving without using the engine 100 and may forget that the vehicle can also run with the engine 100. Accordingly, in the case of such a plug-in hybrid vehicle, a user may be more likely to feel anxiety about whether the vehicle will be unable to run when the residual capacity displayed on the display 204 becomes zero, compared to the case of a hybrid vehicle of which the electricity storage device cannot be charged using an external power supply. Therefore, with the display device 200 mounted on the plug-in hybrid vehicle of the present embodiment, a greater effect of preventing a user feeling anxious can be obtained, compared to the case where the display device 200 is mounted on a hybrid vehicle of which external charging is impossible.

Described above is an explanation based on exemplary embodiments. The embodiment is intended to be illustrative only, and it will be obvious to those skilled in the art that various modifications to a combination of constituting elements or processes could be developed and that such modifications also fall within the scope of the present disclosure.

For example, the aforementioned embodiment describes an example in which the engine 100 could be operated in the EV mode when greater drive power is required; however, vehicle drive power may be generated only by the second electric motor 120 in the EV mode without operating the engine 100. Such a configuration can be provided by increasing drive power of the second electric motor 120, for example. In this case, since the engine 100 is not started in the EV mode, a user is more likely to become familiar with the driving without using the engine 100, compared to the aforementioned embodiment. Therefore, with the display device 200 mounted on such a plug-in hybrid vehicle, a greater effect of preventing a user feeling anxious can be obtained, compared to the case where the display device 200 is mounted on the hybrid vehicle 1 of the aforementioned embodiment.

Also, the display controller 202 may display the SOC greater than zero on the display 204 when the SOC of the electricity storage device 150 is substantially zero, only if the remaining amount of gasoline is a predetermined amount or greater. This prevents the situation in which the vehicle becomes unable to run even with both the engine 100 and the second electric motor 120 because of shortages of gasoline and SOC, while the SOC displayed on the display 204 is not zero.

What is claimed is:

1. A display device mounted on a hybrid vehicle comprising an internal-combustion engine configured to generate vehicle drive power from gasoline, an electric motor configured to generate vehicle drive power from electricity, an electricity storage device configured to store electricity used to drive the electric motor, and a charger configured to externally charge the electricity storage device using electricity from an external power supply, the display device comprising:

a display configured to display a state of charge (SOC) of the electricity storage device; and a display controller configured to fix a display on the display to a specified state of charge (SOC) value which is defined as a value lower than a range of the state of charge (SOC) in which the hybrid vehicle travels in a first driving mode and higher than zero, when remaining amount of the gasoline is a predetermined amount or greater and a current state of charge (SOC) is less than the specified state of charge (SOC) value, and configured not to display a zero amount for the state of charge (SOC) on the display even if the current state of charge (SOC) is zero, the first driving mode being a mode in which internal charging of the electricity storage device by the vehicle drive power from gasoline is limited.

2. The display device of claim 1, wherein the hybrid vehicle further comprises a power generator capable of generating electricity using drive power provided from the internal-combustion engine, and a driving mode controller configured to control switching between the first driving mode and a second driving mode, internal charging of the electricity storage device by the power generator being limited in the first driving mode and internal charging of the electricity storage device by the power generator being controlled in the second driving mode so that the state of charge (SOC) of the electricity storage device is maintained within a predetermined control range.

3. The display device of claim 2, wherein only the electric motor generates the vehicle drive power in the first driving mode.

* * * * *